United States Patent
Sayyah et al.

(10) Patent No.: US 10,615,568 B2
(45) Date of Patent: Apr. 7, 2020

(54) ANTIREFLECTION STRUCTURE FOR INTEGRATED LASER DIODE/PHOTONIC CHIP INTERFACE

(71) Applicant: GM GLOBAL TECHNOLOGY OPERATIONS LLC, Detroit, MI (US)

(72) Inventors: Keyvan Sayyah, Santa Monica, CA (US); Pamela R. Patterson, Los Angeles, CA (US); Biqin Huang, Torrance, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 16/018,852

(22) Filed: Jun. 26, 2018

(65) Prior Publication Data

US 2019/0052047 A1 Feb. 14, 2019

Related U.S. Application Data

(60) Provisional application No. 62/531,414, filed on Jul. 12, 2017.

(51) Int. Cl.
| | |
|---|---|
| *H01S 5/028* | (2006.01) |
| *H01S 5/022* | (2006.01) |
| *G01S 7/481* | (2006.01) |
| *G02B 1/11* | (2015.01) |

(52) U.S. Cl.
CPC ............ *H01S 5/028* (2013.01); *G01S 7/4813* (2013.01); *G02B 1/11* (2013.01); *H01S 5/02256* (2013.01)

(58) Field of Classification Search
CPC ..... H01S 5/028; H01S 5/02256; H01L 31/16; G01S 7/4813; G02B 1/11
See application file for complete search history.

(56) References Cited

U.S. PATENT DOCUMENTS

| | | | |
|---|---|---|---|
| 5,139,879 A * | 8/1992 | Aharoni | C09D 127/12 313/466 |
| 5,283,846 A | 2/1994 | Toyonaka | |
| 5,499,132 A | 3/1996 | Tojo | |
| 6,122,110 A | 11/2000 | Park | |
| 6,229,947 B1 | 5/2001 | Vawter | |
| 6,480,331 B1 | 11/2002 | Cao | |
| 6,962,345 B2 | 11/2005 | Inciong | |
| 7,108,810 B2 * | 9/2006 | Nakamura | B82Y 20/00 264/1.7 |
| 7,359,593 B2 | 4/2008 | Little | |
| 7,481,588 B2 | 1/2009 | Monte | |

(Continued)

OTHER PUBLICATIONS

Hobbs, Philip C. D. "Ultrasensitive laser measurements without tears", Applied Optics, vol. 36, No. 4, Feb. 1, 1997, pp. 903-920.

(Continued)

*Primary Examiner* — William F Kraig
*Assistant Examiner* — Vicki B. Booker
(74) *Attorney, Agent, or Firm* — Cantor Colburn LLP

(57) ABSTRACT

A method of manufacturing a LIDAR chip and applying an anti-reflection (AR) coating to a coupling structure of the LIDAR chip. The coupling structure if formed on a wafer. A pocket is formed in the wafer adjacent the coupling structure. The AR material is deposited on top of the wafer and coupling structure. The AR material is etched to form the AR coating on the coupling structure.

10 Claims, 3 Drawing Sheets

(56) References Cited

U.S. PATENT DOCUMENTS

| | | |
|---|---|---|
| 8,116,602 B2 | 2/2012 | Little |
| 8,121,450 B2 | 2/2012 | Webster |
| 9,122,037 B2 | 9/2015 | Shastri |
| 9,310,471 B2 | 4/2016 | Sayyah et al. |
| 9,335,480 B1 | 5/2016 | Celo |
| 9,575,162 B2 | 2/2017 | Owechko |
| 2001/0030807 A1 | 10/2001 | Ikari |
| 2002/0012167 A1 | 1/2002 | Wills |
| 2004/0070827 A1 | 4/2004 | Li |
| 2005/0018967 A1 | 1/2005 | Huang |
| 2005/0213979 A1 | 9/2005 | Nakashima |
| 2006/0002443 A1* | 1/2006 | Farber .................. H01S 5/141 372/50.1 |
| 2010/0200898 A1* | 8/2010 | Lin .................. H01L 27/14618 257/294 |
| 2012/0152918 A1 | 6/2012 | Li |
| 2013/0209033 A1 | 8/2013 | Luff |
| 2015/0042992 A1 | 2/2015 | Cui |
| 2017/0153319 A1 | 6/2017 | Villeneuve |
| 2017/0184450 A1 | 6/2017 | Doylend |
| 2017/0336565 A1 | 11/2017 | Ryckman |
| 2017/0370676 A1 | 12/2017 | Volfson |
| 2018/0024299 A1 | 1/2018 | Leijtens |

OTHER PUBLICATIONS

Schroedter et al., "Microcontroller based closed-loop control of a 2D quasi-static/resonant microscanner with on-chip piezo-resistive sensor feedback", Proc. of SPIE, vol. 10116, 2017, pp. 1-12.

Winter et al., "Micro-beamer based on MEMS micro-mirrors and laser light source", Procedia Chemistry, vol. 1, Issue 1, 2009, pp. 1311-1314.

* cited by examiner

ANTIREFLECTION STRUCTURE FOR INTEGRATED LASER DIODE/PHOTONIC CHIP INTERFACE

CROSS-REFERENCE TO RELATED APPLICATIONS

This application claims the benefit of priority of U.S. Provisional Application No. 62/531,414 filed Jul. 12, 2017, the disclosure of which is incorporated herein by reference in its entirety.

INTRODUCTION

The subject disclosure relates to methods for manufacturing a LIDAR (Light Detection and Ranging) chip and, in particular, to manufacturing an anti-reflection face on a structure of the LIDAR chip.

A LIDAR chip includes a photonic chip, an integrated laser and an optical coupling structure, among other components. An anti-reflection coating is generally placed between the optical coupling structure and the laser in order to reduce back-reflection of light from the optical coupling structure into the laser cavity which can degrade its linewidth and optical stability. During the manufacturing process, attempts to deposit the anti-reflection coating on the coupling structure prior to integrating the laser to the photonic chip can be slow and costly. Accordingly, it is desirable to provide an efficient method of depositing the anti-reflection coating at the optical coupler of the LIDAR chip.

SUMMARY

In one exemplary embodiment, a method of manufacturing a LIDAR chip is disclosed. The method includes forming a coupling structure on a wafer, forming a pocket in the wafer adjacent the coupling structure, depositing an anti-reflection (AR) material on top of the wafer and coupling structure, and etching the AR material to form an AR coating on the coupling structure.

In addition to one or more of the features described herein, a sidewall of the pocket is coplanar with a vertical facet of the coupling structure and the AR coating is formed along the sidewall of the pocket and the vertical facet of the coupling structure. A laser die is attached in the pocket, and the pocket is formed to a depth at which a light emitted from the output port of the laser die is directed into an input port of the coupling structure. In an embodiment, the laser die is attached with a light port of the laser die at a distance of about 2 to 3 microns from the AR coating. The method further includes depositing the AR coating by performing one of spin-on deposition; and physical vapor deposition. The AR is a fluoropolymer in an embodiment.

In another exemplary embodiment, a method of applying an anti-reflection (AR) coating to a coupling structure of a LIDAR chip is disclosed. The method includes forming the coupling structure on a wafer, forming a pocket in the wafer adjacent the coupling structure, depositing an AR material on top of the wafer and coupling structure, and etching the AR material to form the AR coating on a vertical facet of the coupling structure.

In addition to one or more of the features described herein, a sidewall of the pocket is coplanar with the vertical facet of the coupling structure and the AR coating is formed along the sidewall of the pocket and the vertical facet of the coupling structure. A laser die is attached in the pocket, wherein the pocket is formed to a depth at which a light emitted from the output port of the laser die is directed into an input port of the coupling structure. The laser die is deposited with a light port of the laser die at a distance of about 2 to 3 microns from the AR coating. The AR coating is deposited by performing one of spin-on deposition, and physical vapor deposition. In an embodiment, the AR material is a fluoropolymer.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
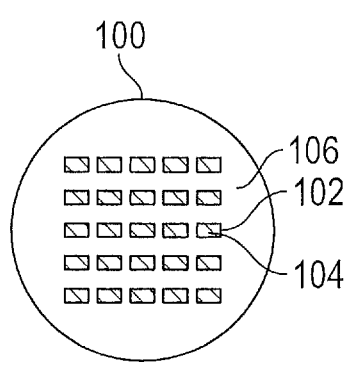
FIG. 1 depicts a wafer used to manufacture multiple LIDAR chips.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 depicts a wafer 100 used to manufacture multiple LIDAR chips. The wafer 100 includes a plurality of die regions 102 having pockets 104 in which laser die are heterogeneously integrated onto the LIDAR chips. Once the laser die are integrated, the wafer 100 can be divided into individual chip dies, each of which includes a LIDAR chip.

Figure 2:
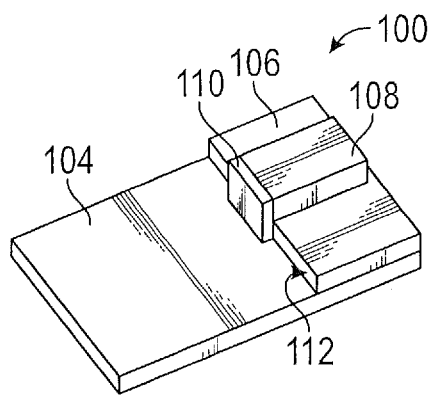
FIG. 2 shows a detailed view of a portion of a pocket of the wafer of FIG. 1.

FIG. 2 shows a detailed view of a portion of a pocket 104 of the wafer 100 of FIG. 1. The pocket 104 is a groove or depression formed below a top surface 106 of the wafer 100. An optical coupling structure 108 is formed on the top surface 106 of the wafer 100 at an edge of the pocket 104. As described further herein, a vertical facet of the coupling structure 108 is aligned with a vertical face of a side wall 112 of the pocket 104. An anti-reflection coating 110 is formed at the side wall 112 of the pocket 104 and extends upward to cover the facet of the coupling structure 106 proximate the side wall 112.

FIGS. 3-9 show various manufacturing stages for the LIDAR chip 100. While FIGS. 3-9 illustrate manufacture of a single LIDAR chip, it is understood that the stages shown in FIGS. 3-9 can be performed for a plurality of dies 102 of the wafer 100 simultaneously. Therefore, multiple LIDAR chips can be made simultaneously using the methods discussed with respect to FIGS. 3-9.

Figure 3:
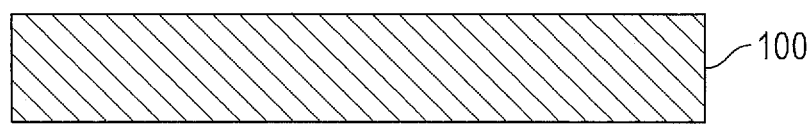
FIG. 3 shows a first stage for manufacturing a LIDAR chip on a wafer according to an embodiment.
Figure 4:
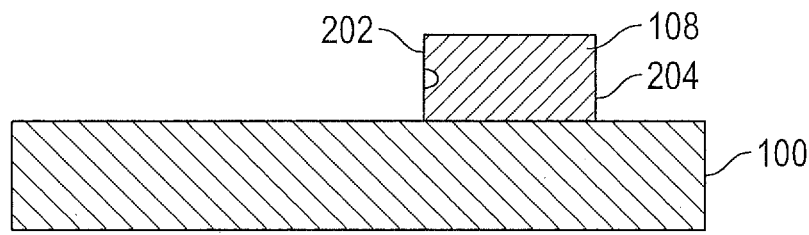
FIG. 4 shows a subsequent stage of the manufacturing process.

FIG. 3 shows a first stage for manufacturing a LIDAR chip on a wafer according to an embodiment in which a wafer substrate 100 is provided. FIG. 4 shows a subsequent stage of the manufacturing process. A coupling structure 108 is formed on the wafer 100 at a selected location. The coupling structure 108 includes a laser-side facet 202 and a chip-side facet 204. Upon completion of the LIDAR chip, the coupling structure 108 is formed on the wafer 100 with the laser-side facet 202 oriented in a selected direction.

Figure 5:
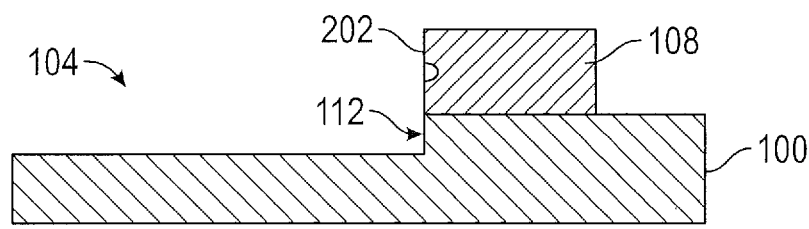
FIG. 5 shows a subsequent stage of the manufacturing process.

FIG. 5 shows a subsequent stage of the manufacturing process. A pocket 104 is formed in the wafer 100 to a selected depth. The pocket 104 can be formed by etching or other suitable methods. The pocket 104 is formed next to the laser-side facet 202 of the coupling structure 108 so that a vertical side wall 112 of the pocket 104 is coplanar with the laser-side facet 202. The pocket 104 is formed to a depth selected so that once the laser die is placed in the pocket 104, light emitted from the output port of the laser die is directed into an input port of the coupling structure 108.

Figure 6:
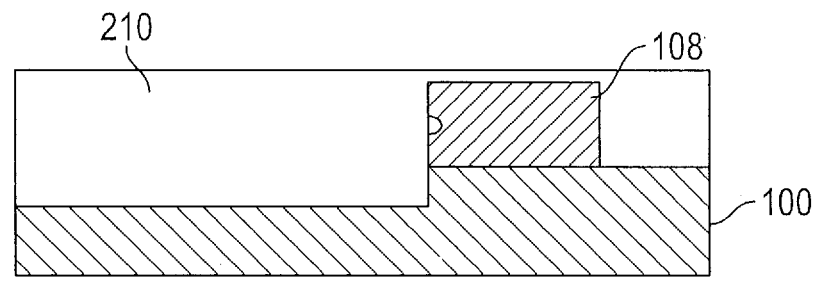
FIG. 6 shows a subsequent stage of the manufacturing process.

FIG. 6 shows a subsequent stage of the manufacturing process. The wafer 100 is filled with anti-reflection (AR) material 210. The AR material 210 can be deposited over a plurality of coupling structures of the wafer 100. In various embodiments, the AR material 210 can be deposited by physical vapor deposition or other suitable deposition technique. The AR material 210 can be spin-on polymer such as Cytop™ or other material that achieves a low refractive index (about n=1.3). In an embodiment in which the coupling structure 108 includes a SiON-based material, the AR material 210 can be a fluoropolymer.

Figure 7:
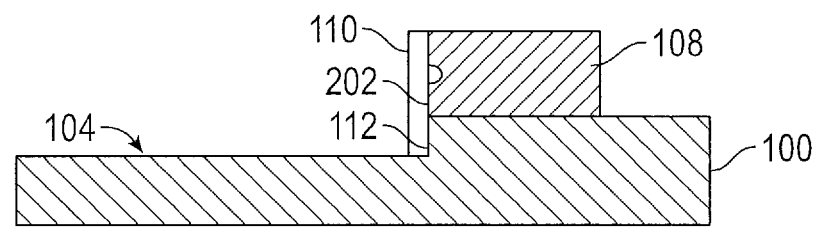
FIG. 7 shows a subsequent stage of the manufacturing process.

FIG. 7 shows a subsequent stage of the manufacturing process. The AR material 210 is patterned and etched to produce an AR coating 110 at the laser-side facet 202 of the coupling structure 108. The AR coating 110 can extend vertically along the sidewall 112 of the pocket 104 and along the laser-side facet 202 of the coupling structure 108.

Figure 8:
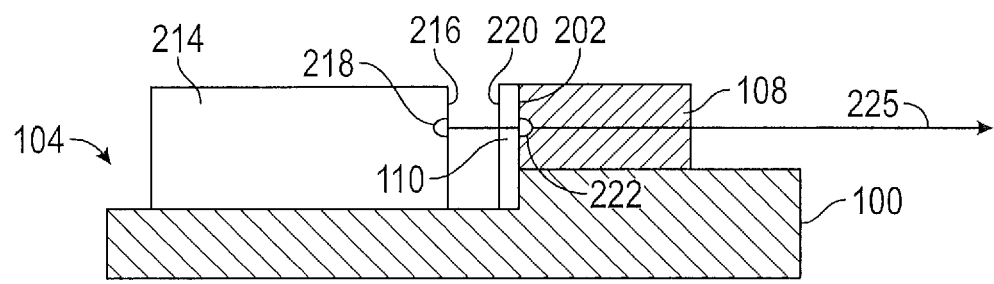
FIG. 8 shows a subsequent stage of the manufacturing process.

FIG. 8 shows a subsequent stage of the manufacturing process. A laser die 214 is deposited or attached in the pocket 104 of the wafer chip. The laser die 214 includes a light output face 216. The laser die 214 is attached so that its output face 216 is a few microns from an exposed vertical face 220 of the AR coating 110. In various embodiments, the laser die 214 is attached so that its output face 216 is between 2 and 3 microns from the exposed vertical face 220 of the AR coating 110. Once the laser die 214 is attached in the pocket 104 its output port 218 is aligned with an input port 222 at the laser-side facet 202 of the coupling structure 108. Thus an outgoing light beam 225 from the output port 218 of the laser die 214 passes directly into a corresponding input port 222 of the coupling structure 108.

Figure 9:
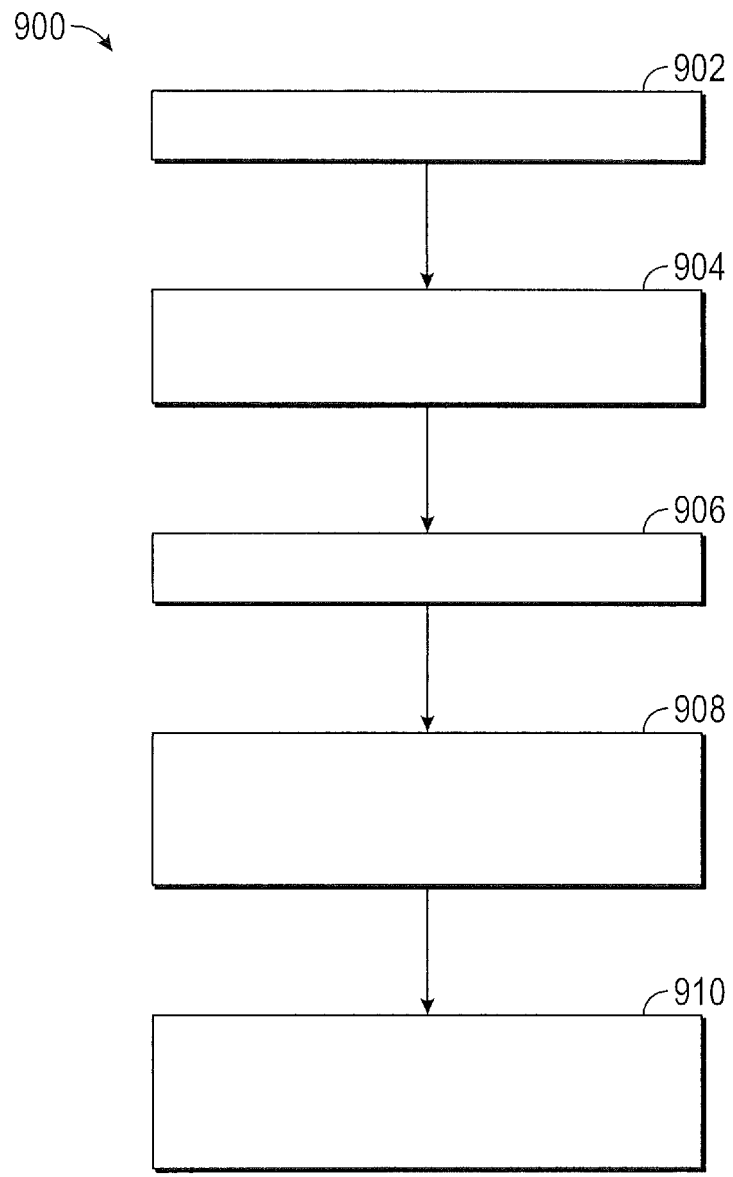
FIG. 9 shows a flowchart illustrating a method of manufacturing an anti-reflection coating on an optical coupler of a LIDAR chip.

FIG. 9 shows a flowchart illustrating a method 900 of manufacturing an AR coating on an optical coupler of a LIDAR chip. In Box 902, the optical coupler is formed on a wafer. In Box 904, a pocket is etched in the wafer proximate the optical coupler. In Box 906, AR material is deposited over the wafer in order to cover the pocket, wafer and optical coupler. In Box 908, the AR material is etched in order to produce the AR coating along a facet of the optical coupler. In Box 910, a laser die is attached in the pocket of the wafer with the output port of the laser die being in optical communication with an input port of the optical coupler.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of manufacturing a LIDAR chip, comprising:
forming a coupling structure on a top surface of a wafer;
forming a pocket below the top surface of the wafer adjacent the coupling structure, wherein a sidewall of the pocket is coplanar with a vertical facet of the coupling structure;
depositing an anti-reflection (AR) material on top of the wafer and coupling structure; and
etching the AR material to form an AR coating along the sidewall of the pocket and the vertical facet of the coupling structure.

2. The method of claim 1 further comprising attaching a laser die in the pocket, wherein the pocket is formed to a depth at which a light emitted from an output port of the laser die is directed into an input port of the coupling structure.

3. The method of claim 2, further comprising attaching the laser die with a light port of the laser die at a distance of about 2 to 3 microns from the AR coating.

4. The method of claim 1, further comprising depositing the AR coating by performing one of: (i) spin-on deposition; and (ii) physical vapor deposition.

5. The method of claim 1, wherein the AR material is a fluoropolymer.

6. A method of applying an anti-reflection (AR) coating to a coupling structure of a LIDAR chip, comprising:
forming the coupling structure on a top surface of a wafer;
forming a pocket below the top surface of the wafer adjacent the coupling structure, wherein a sidewall of the pocket is coplanar with a vertical facet of the coupling structure;
depositing an AR material on top of the wafer and coupling structure; and
etching the AR material to form the AR coating along the sidewall of the pocket and the vertical facet of the coupling structure.

7. The method of claim 6 further comprising attaching a laser die in the pocket, wherein the pocket is formed to a depth at which a light emitted from an output port of the laser die is directed into an input port of the coupling structure.

8. The method of claim 7, further comprising depositing the laser die with a light port of the laser die at a distance of about 2 to 3 microns from the AR coating.

9. The method of claim 6, further comprising depositing the AR coating by performing one of: (i) spin-on deposition; and (ii) physical vapor deposition.

10. The method of claim 6, wherein the AR material is a fluoropolymer.

* * * * *